United States Patent
Ng

(10) Patent No.: US 9,628,918 B2
(45) Date of Patent: Apr. 18, 2017

(54) SEMICONDUCTOR DEVICE AND A METHOD FOR FORMING A SEMICONDUCTOR DEVICE

(71) Applicant: Infineon Technologies AG, Neubiberg (DE)

(72) Inventor: Chee Yang Ng, Johor (MY)

(73) Assignee: Infineon Technologies AG, Neubiberg (DE)

( * ) Notice: Subject to any disclaimer, the term of this patent is extended or adjusted under 35 U.S.C. 154(b) by 121 days.

(21) Appl. No.: 14/088,747

(22) Filed: Nov. 25, 2013

(65) Prior Publication Data

US 2015/0146894 A1 May 28, 2015

(51) Int. Cl.
*H04R 19/00* (2006.01)
*B81C 1/00* (2006.01)
*H04R 19/04* (2006.01)

(52) U.S. Cl.
CPC ......... *H04R 19/005* (2013.01); *B81C 1/0023* (2013.01); *B81C 1/00238* (2013.01); *H04R 19/04* (2013.01); *B81B 2201/0257* (2013.01); *H01L 2224/16245* (2013.01); *H01L 2224/48091* (2013.01); *H01L 2224/48145* (2013.01); *H01L 2224/48247* (2013.01); *H01L 2224/48471* (2013.01); *H04R 2499/11* (2013.01)

(58) Field of Classification Search
CPC .. H01L 2924/1461; H01L 2224/48227; H04R 19/005; H04R 1/04; H04R 1/06; H04R 2201/003; B81B 2201/0257; B81B 2201/0264; B81C 1/0023; B81C 2203/0154

See application file for complete search history.

(56) References Cited

U.S. PATENT DOCUMENTS

| | | | | |
|---|---|---|---|---|
| 2005/0186703 A1* | 8/2005 | Weiblen | ............... | B81B 7/0051 438/106 |
| 2007/0158826 A1* | 7/2007 | Sakakibara | ........... | B81B 7/0064 257/723 |
| 2008/0197485 A1* | 8/2008 | Theuss | .................. | B81B 7/0077 257/723 |
| 2008/0315333 A1* | 12/2008 | Combi | .................. | B81B 7/0061 257/415 |
| 2009/0001553 A1* | 1/2009 | Pahl | ..................... | B81B 7/0064 257/704 |
| 2010/0090295 A1* | 4/2010 | Zhe | ......................... | B81B 7/007 257/415 |
| 2011/0293126 A1* | 12/2011 | Maekawa | ........... | H04R 19/005 381/355 |
| 2012/0027234 A1* | 2/2012 | Goida | ..................... | H04R 1/04 381/150 |

(Continued)

FOREIGN PATENT DOCUMENTS

WO    2012015584 A1    2/2012

*Primary Examiner* — Matthew Eason
(74) *Attorney, Agent, or Firm* — Eschweiler & Associates, LLC

(57) ABSTRACT

A semiconductor device includes a microphone module implemented on a first semiconductor die and a signal processing module implemented on a second semiconductor die. The microphone module includes a movable microphone element arranged at a main side of the first semiconductor die and the second semiconductor die is mounted to the main side of the first semiconductor die.

16 Claims, 12 Drawing Sheets

(56) References Cited

U.S. PATENT DOCUMENTS

| | | | |
|---|---|---|---|
| 2012/0181639 A1* | 7/2012 | Ehrenpfordt | B81B 7/0061 257/416 |
| 2012/0212925 A1* | 8/2012 | Zoellin | H04R 19/005 361/807 |
| 2012/0280335 A1* | 11/2012 | Zoellin | H04R 19/04 257/416 |
| 2013/0322675 A1* | 12/2013 | Zoellin | H04R 1/04 381/355 |
| 2014/0070382 A1* | 3/2014 | Goida | B81B 7/0032 257/666 |
| 2014/0294221 A1* | 10/2014 | Harney | H04R 1/342 381/360 |
| 2014/0299949 A1* | 10/2014 | Conti | B81B 7/0061 257/416 |

* cited by examiner

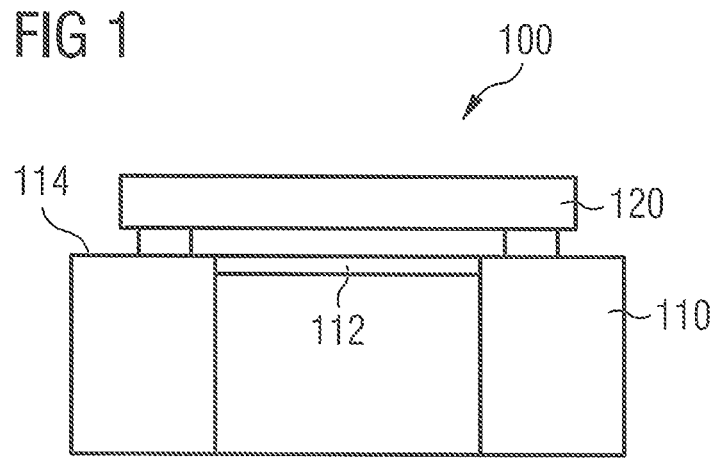

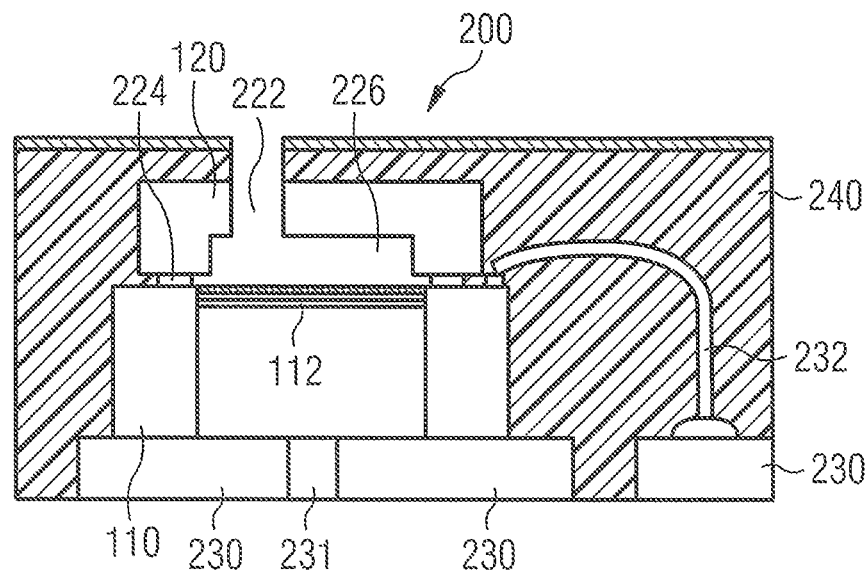
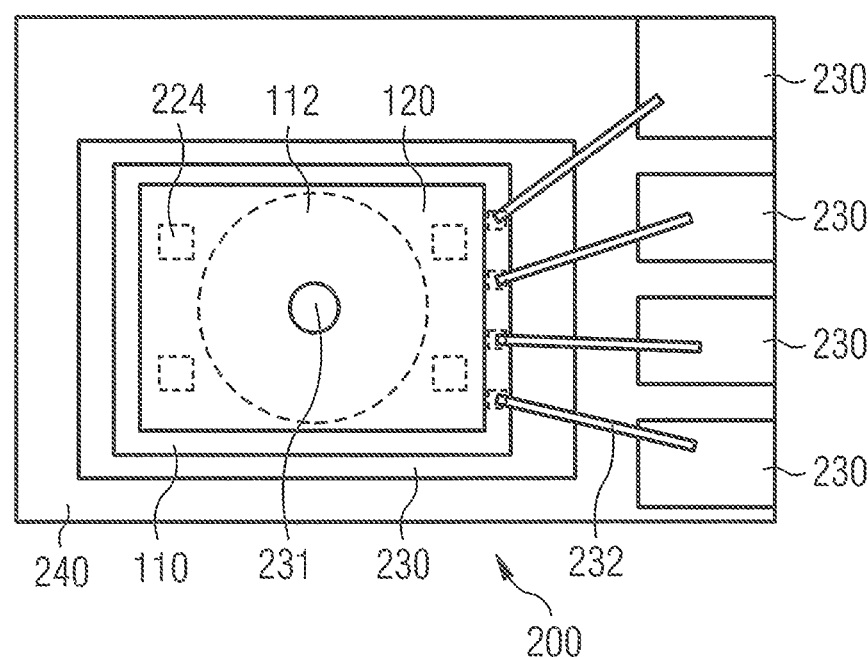

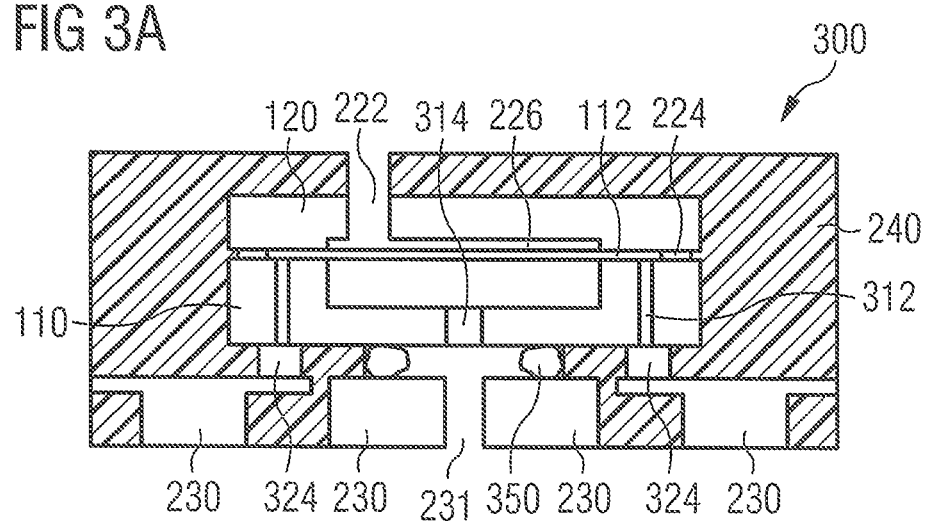
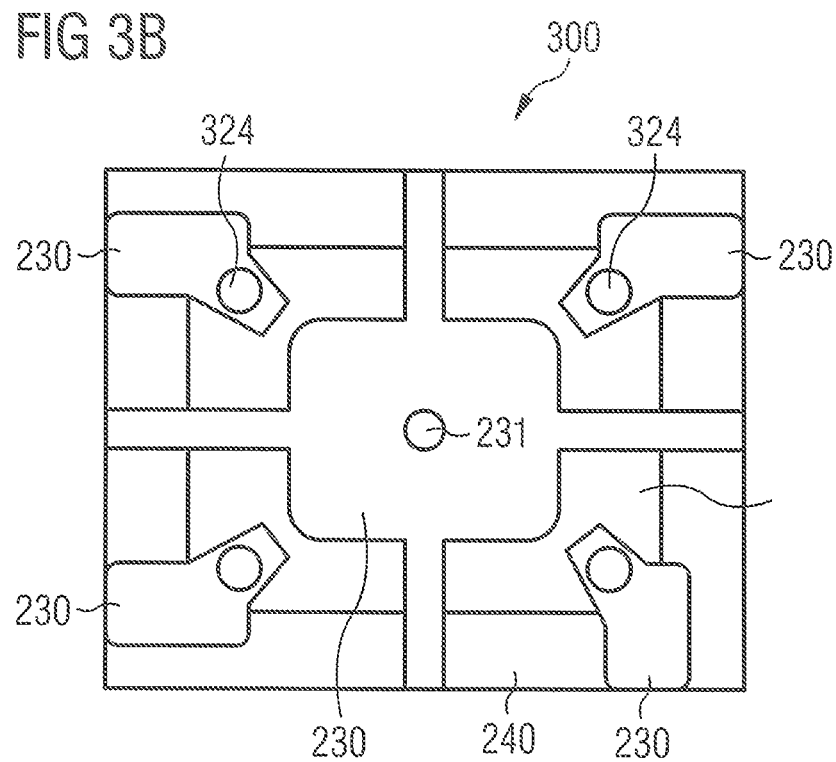

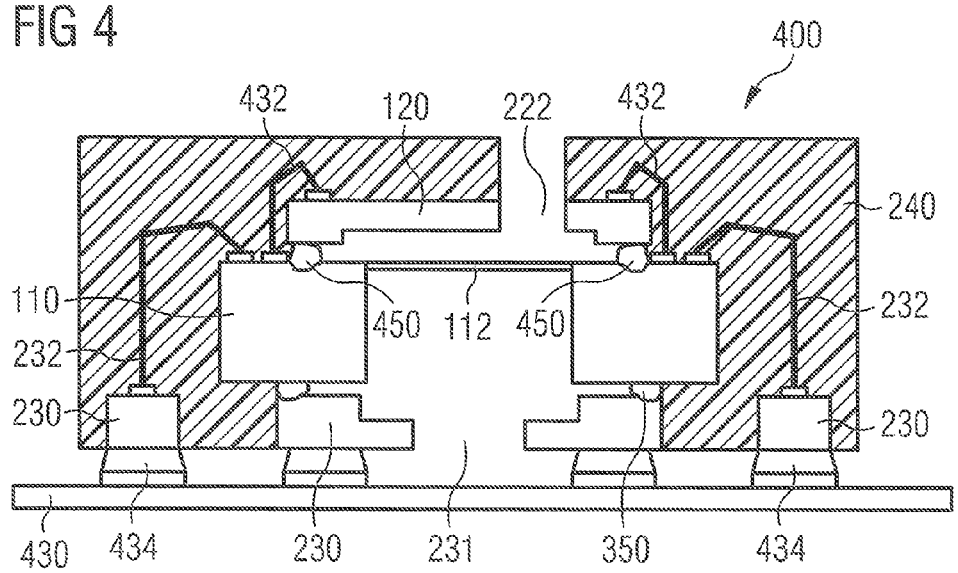
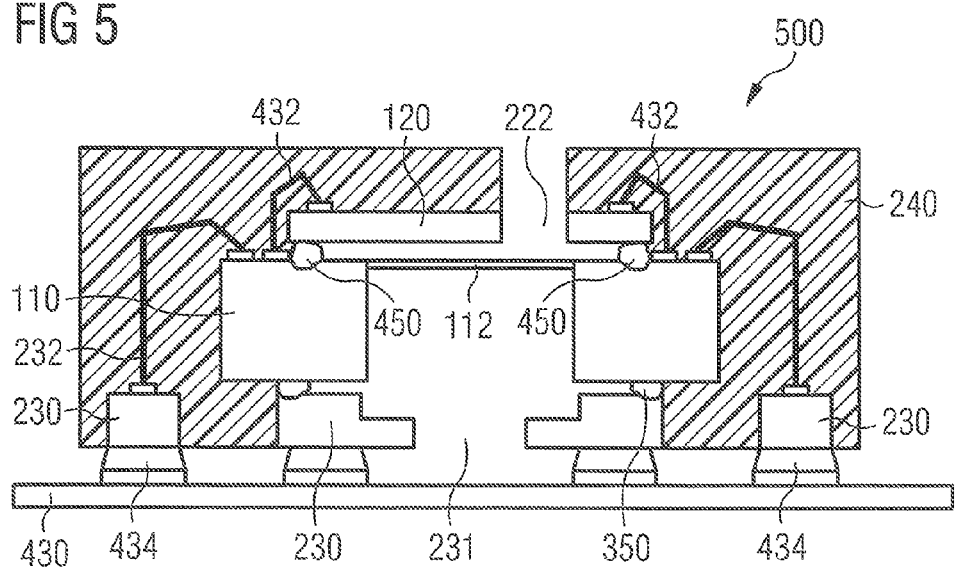

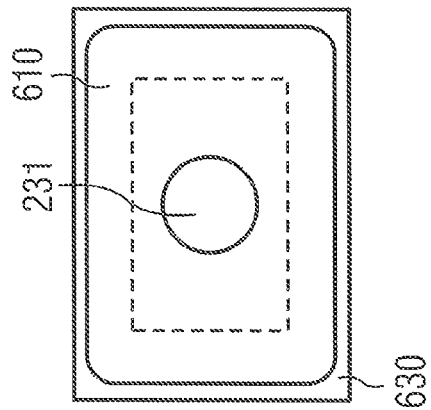
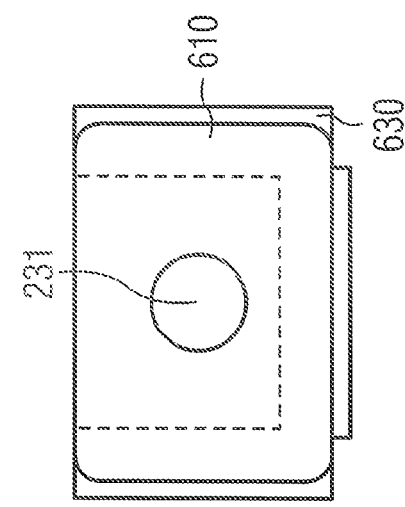
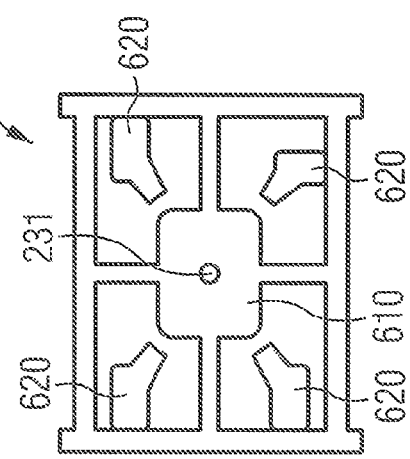

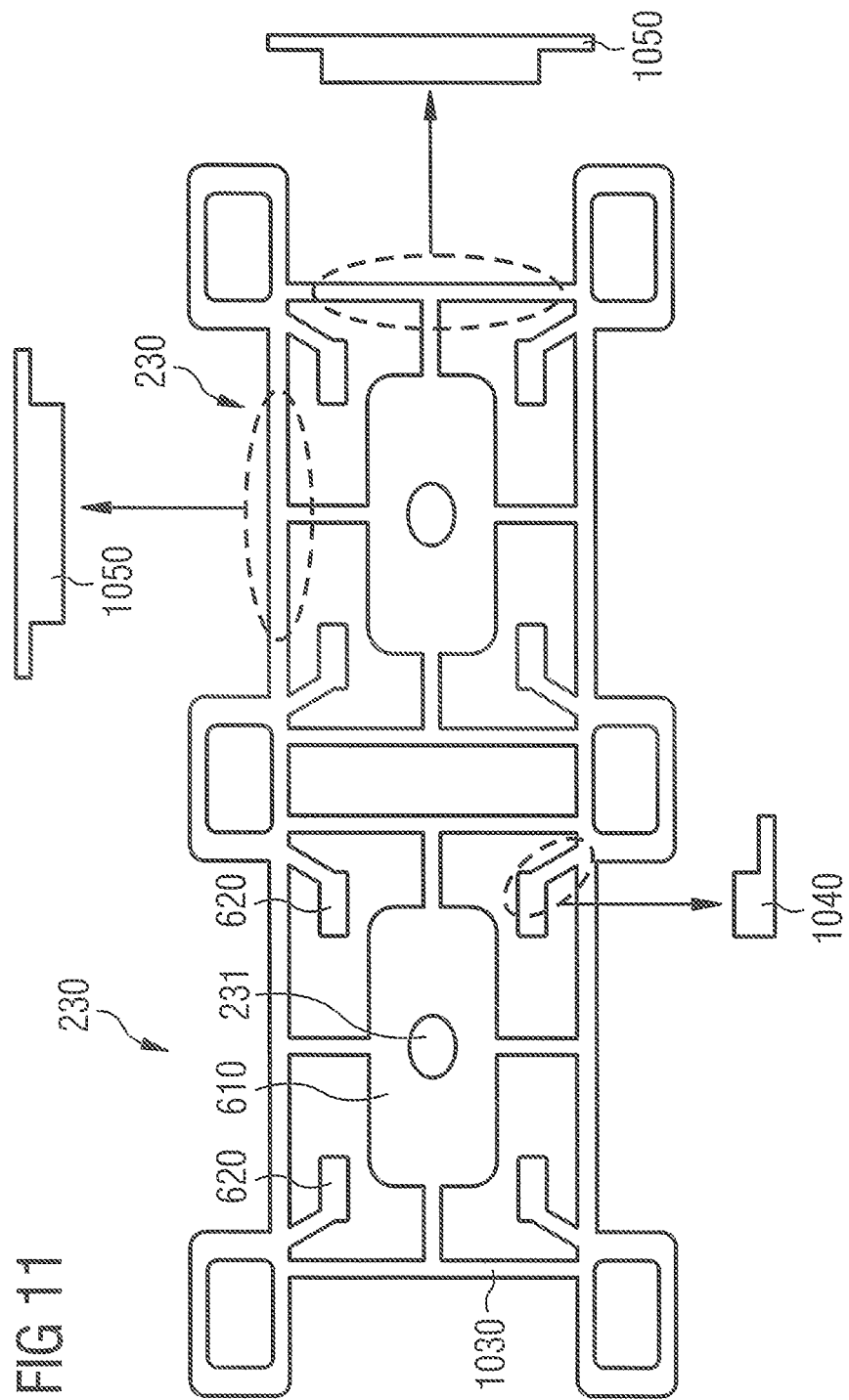

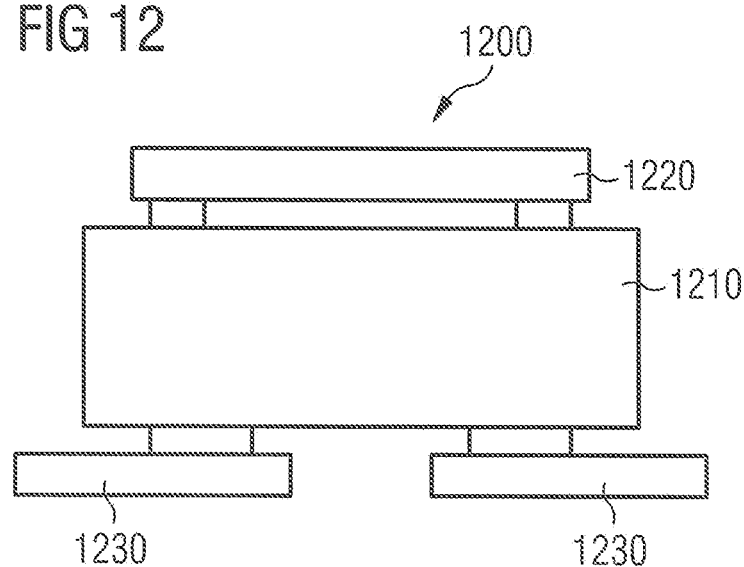
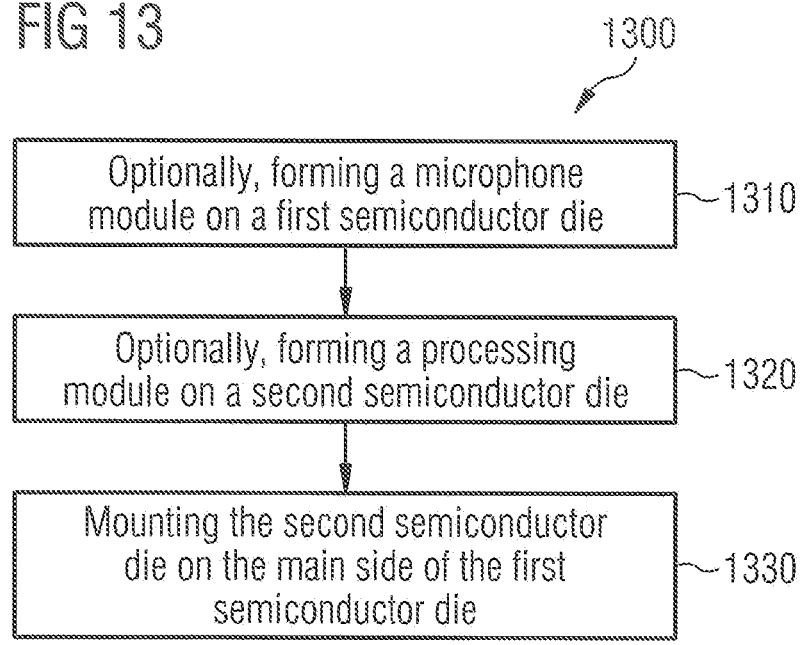

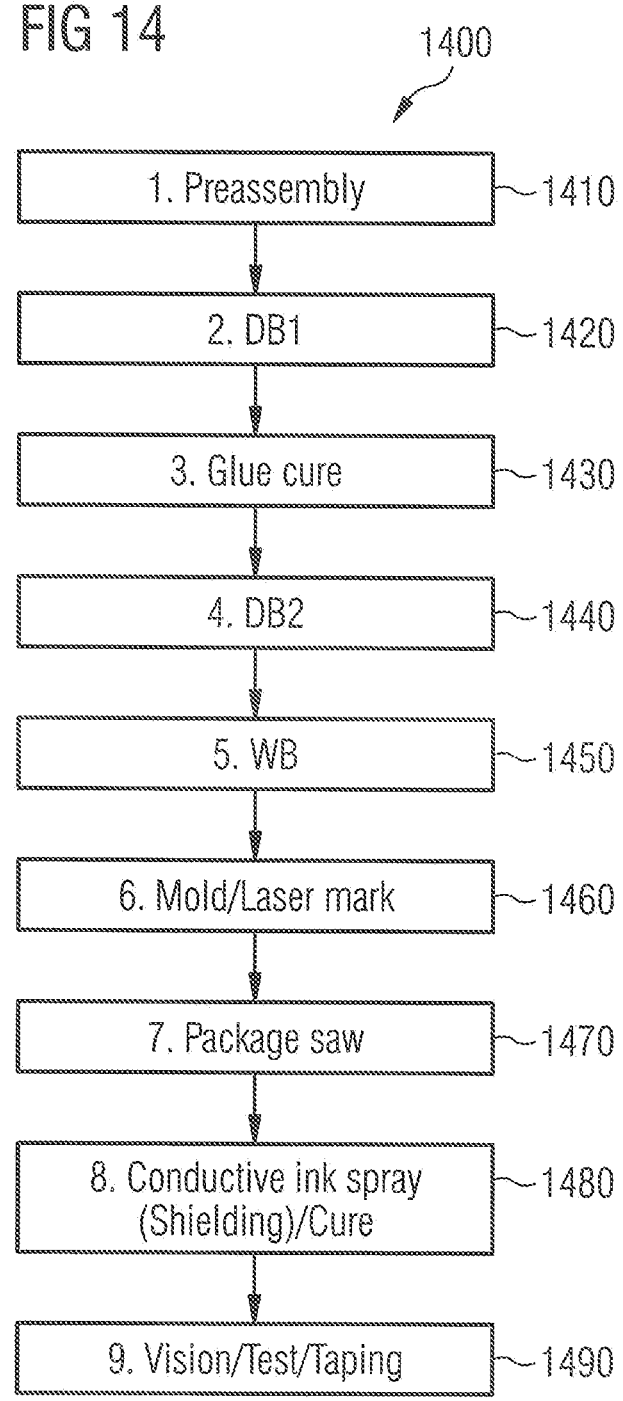

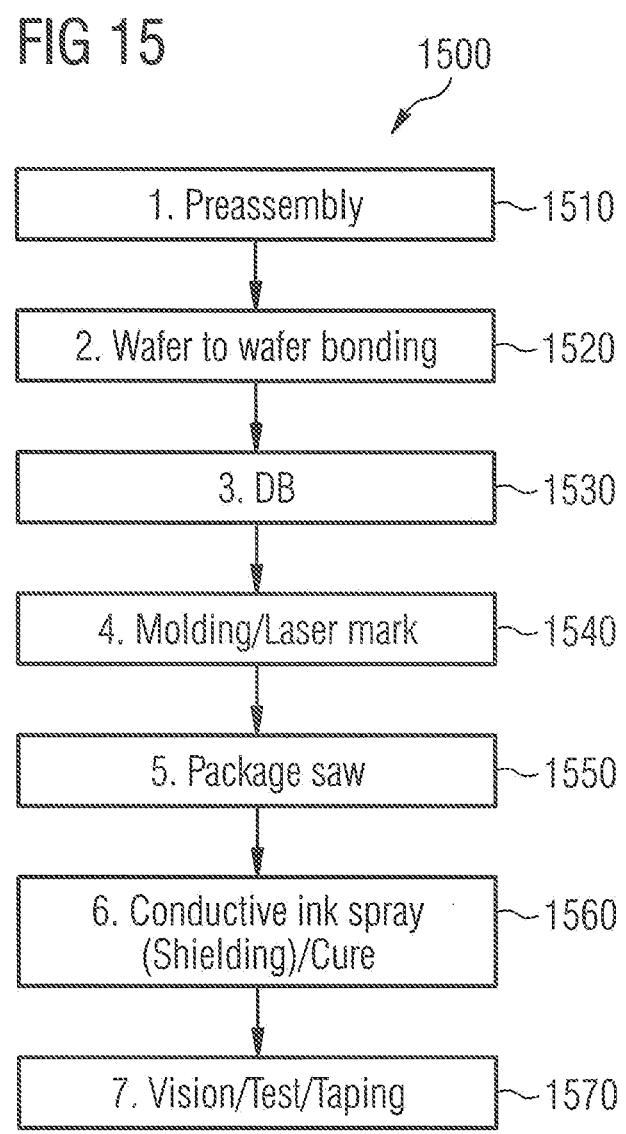

SEMICONDUCTOR DEVICE AND A METHOD FOR FORMING A SEMICONDUCTOR DEVICE

FIELD

Embodiments relate to semiconductor-based microphones and in particular to a semiconductor device and a method for forming a semiconductor device.

BACKGROUND

Semiconductor-based microphones are used in many applications. For example, many cell phones and headsets as well as most laptops and tablets make use of microphones. It is desired that such microphones require only small space due to the limited available space within mobile devices, while providing good performance.

SUMMARY

Some embodiments relate to a semiconductor device comprising a microphone module implemented on a first semiconductor die and a signal processing module implemented on a second, different semiconductor die. The microphone module comprises a movable microphone element arranged at a main side of the first semiconductor die and the second semiconductor die is mounted to the main side of the first semiconductor die.

Some further embodiments relate to a semiconductor device comprising a microphone module implemented on a first semiconductor die and a signal processing module implemented on a second, different semiconductor die. The second semiconductor die is mounted to a first side of the first semiconductor die. Further, the semiconductor device comprises a lead frame mounted to a second side of the first semiconductor die.

Some embodiments relate to a method for forming a semiconductor device comprising a microphone module implemented on the first semiconductor die and a signal processing module implemented on a second, different semiconductor die. Further, the microphone module comprises a movable microphone element arranged at a main side of the first semiconductor die. The method comprises mounting the second semiconductor die to the main side of the first semiconductor die.

BRIEF DESCRIPTION OF THE DRAWINGS

Some embodiments of apparatuses and/or methods will be described in the following by way of example only, and with reference to the accompanying figures, in which FIG. 1 shows a schematic cross-section of a semiconductor die;

FIG. 2A shows a schematic cross-section of a semiconductor die;

FIG. 2B shows a schematic top view of the semiconductor device shown in FIG. 2A;

FIG. 3A shows a schematic cross-section of a semiconductor device;

FIG. 3B shows a schematic top view of the semiconductor device shown in FIG. 3A;

FIG. 4 shows a schematic cross-section of a semiconductor device;

FIG. 5 shows a schematic cross-section of a further semiconductor device;

FIG. 6A shows a schematic top view of a lead frame of the semiconductor device shown in FIG. 5;

FIG. 6B shows a schematic top view of a possible soldering pattern for the semiconductor device shown in FIG. 5;

FIG. 6C shows a schematic top view of another possible soldering pattern for a semiconductor device shown in FIG. 5;

FIG. 11 shows a schematic top view of lead frames;

FIG. 12 shows a schematic cross-section of a semiconductor device;

FIG. 13 shows a flowchart of a method for forming a semiconductor device;

FIG. 14 shows a flowchart of a further method for forming a semiconductor device; and FIG. 15 shows a flowchart of a further method for forming a semiconductor device.

DETAILED DESCRIPTION

Figure 7:
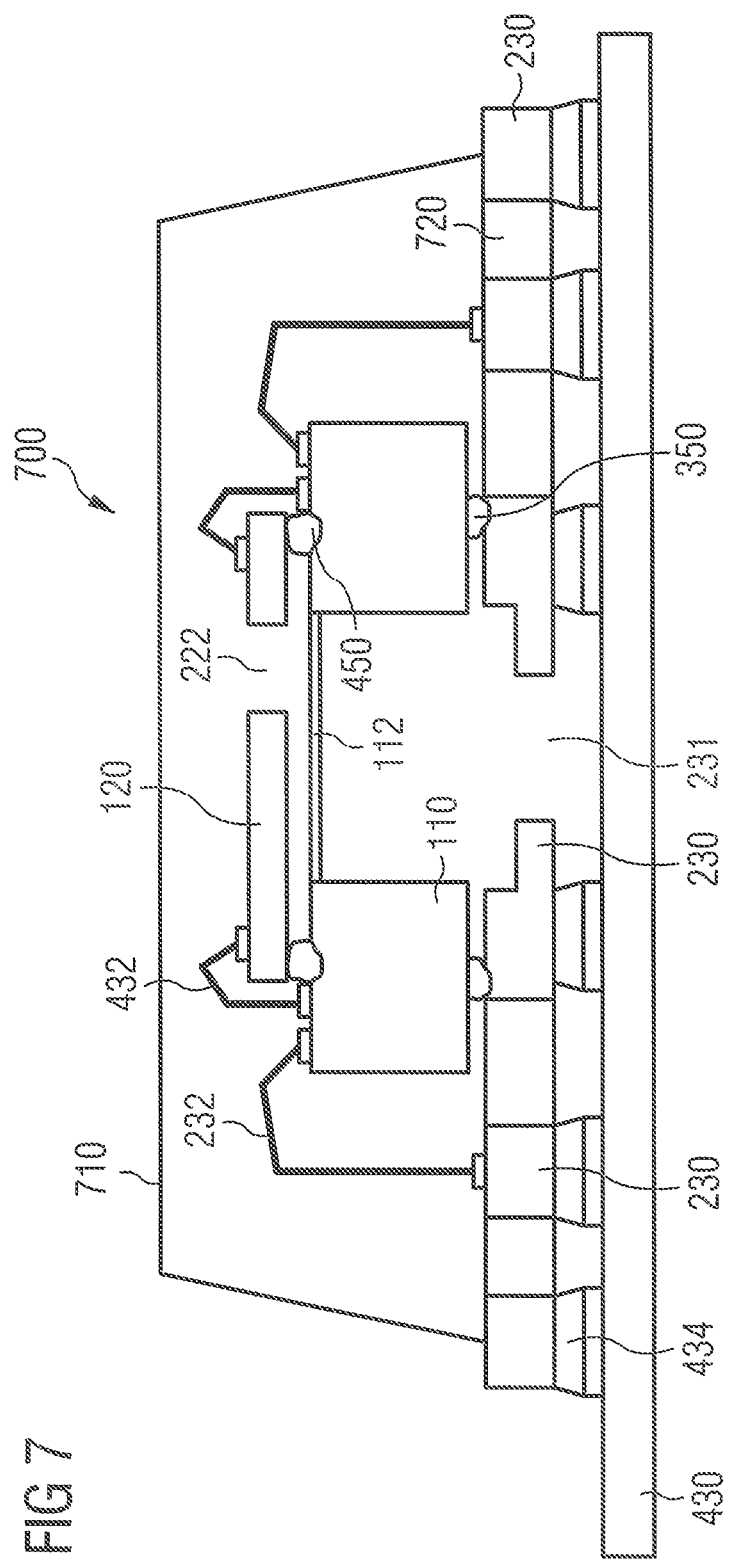
FIG. 7 shows a schematic cross-section of a semiconductor device.

Various example embodiments will now be described more fully with reference to the accompanying drawings in which some example embodiments are illustrated. In the figures, the thicknesses of lines, layers and/or regions may be exaggerated for clarity.

Accordingly, while example embodiments are capable of various modifications and alternative forms, embodiments thereof are shown by way of example in the figures and will herein be described in detail. It should be understood, however, that there is no intent to limit example embodiments to the particular forms disclosed, but on the contrary, example embodiments are to cover all modifications, equivalents, and alternatives falling within the scope of the disclosure. Like numbers refer to like or similar elements throughout the description of the figures.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Unless otherwise defined, all terms (including technical and scientific terms) used herein have the same meaning as commonly understood by one of ordinary skill in the art to which example embodiments belong. It will be further understood that terms, e.g., those defined in commonly used dictionaries, should be interpreted as having a meaning that is consistent with their meaning in the context of the relevant art and will not be interpreted in an idealized or overly formal sense unless expressly so defined herein.

FIG. 1 shows a schematic cross-section of a semiconductor device 100 according to an embodiment. The semiconductor device 100 comprises a microphone module implemented on a first semiconductor die 110 and a signal processing module implemented on a second semiconductor die 120. The microphone module comprises a movable microphone element 112 arranged at a main side 114 of the first semiconductor die 110. The second semiconductor die 120 is mounted to the main side of the first semiconductor die 110.

By mounting the second semiconductor die 120 on the first semiconductor die 110, the space consumption of the semiconductor device 100 can be significantly reduced. By implementing the microphone module and the signal processing module on separate semiconductor dies, the manufacturing technology may be adapted to the respective requirements more efficiently (e.g. complementary metal-oxide semiconductor CMOS technology for the second semiconductor die and micro-electro-mechanical system MEMS technology for the first semiconductor die). Further, in some embodiments, the movable microphone element 112 may be protected by the second semiconductor die 120 against damages during manufacturing or handling due to the arrangement at the main side of the first semiconductor die 110.

The microphone module may be an electrical circuit capable of generating a microphone signal containing information on a movement of the movable microphone element 112 caused by acoustic waves reaching the movable microphone element 112, for example. The movable microphone element 112 may be a micro-electro-mechanical element (e.g. a membrane). The movable microphone element 112 may be bent or deformed in response to an applied force. In other words, the movable microphone element 112 may be moved or deformed by a variation of a sound pressure at the position of the movable microphone element 112. The movement of the movable microphone element 112 may be determined, detected or measured by the microphone module. Further, the microphone module may provide a microphone signal based on a measured or determined movement of the movable microphone element 112. The microphone signal may comprise a voltage or current proportional to or dependent on a deformation of the movable microphone element 112 or may contain information derived from a deformation of the movable microphone element 112. The microphone signal may be an analog or digital signal to be provided to the signal processing module on the second semiconductor die 120. The microphone module may comprise electrical elements for determining, detecting or measuring the deformation of the movable microphone element, for filtering and/or amplifying signals and/or for an analog-to-digital conversion of signals and/or other elements, for example.

The semiconductor device 100 or the respective semiconductor dies may be implemented by any semiconductor processing technology capable of forming the mentioned modules, for example. In other words, the first semiconductor die 110 and/or the second semiconductor die 120 of the semiconductor device 100 may comprise a silicon-based semiconductor substrate, a silicon carbide-based semiconductor substrate, a gallium arsenide-based semiconductor substrate or a gallium nitride-based semiconductor substrate, for example.

The first semiconductor die 110 and/or the second semiconductor die 120 may each comprise a semiconductor substrate and optionally one or more metal layers, insulation layers and/or passivation layers on top of the semiconductor substrate.

The movable microphone element 112 may be implemented within a semiconductor substrate of the first semiconductor die 110 (e.g. silicon membrane) or by a metal layer on top of a semiconductor substrate of the first semiconductor die 110. In both cases, the movable microphone element may be located close to a surface of the first semiconductor die 110 or may represent a part of the surface. The surface of the first semiconductor die 110 close to the movable microphone element 112 represents the main side 114 of the first semiconductor die 110. In other words, the movable microphone element 112 may represent a main element of the first semiconductor die 110 so that the side of the first semiconductor die 110 comprising the movable microphone element 112 represents the main side 114 of the first semiconductor die 110.

The main side 114 of the first semiconductor die 110 may be a surface of the first semiconductor die 110 represented by a surface of a semiconductor substrate, a metal layer, an insulation layer and/or passivation layer on top of the semiconductor substrate. In comparison to a basically vertical edge (e.g. resulting from separating the semiconductor substrate from others) of the semiconductor die, the main side 114 of the first semiconductor die 110 may be a basically horizontal surface extending laterally. The main side 114 of the first semiconductor die 110 may be a basically even plane (e.g. neglecting unevenness of the semiconductor die due to the manufacturing process or pads). Further, a lateral direction or lateral expansion may be oriented basically in parallel to the main side 114 and a vertical direction or vertical expansion may be oriented basically orthogonal to the main side 114.

The signal processing module may be configured to process signals provided by the microphone module, for example. In other words, a microphone signal generated by the microphone module may be provided to the signal processing module through at least one electrical connection between the first semiconductor die 110 and the second semiconductor die 120. The signal processing module may process the microphone signal in various ways and may provide a processed output signal to an output interface of the semiconductor device 100. The semiconductor device 100 may be connected to an external device or may be part of an application using the processed output signal. For example, the signal processing module may process the microphone signal by an analog-to-digital conversion, filtering, amplification and/or conversion to an audio signal format required by the external device or the application.

The second semiconductor die 120 can be mounted to the main side 114 of the first semiconductor die 110 in various ways. For example, the second semiconductor die 120 may be soldered to the first semiconductor die (e.g. in a flip-chip configuration) or may be glued to the first semiconductor die 110, leaving a gap between the movable microphone element 112 and the second semiconductor die 120. Alternatively, the second semiconductor die 120 may be significantly smaller than the first semiconductor die 110 and may be mounted on the main side 114 of the first semiconductor device 110, laterally beside the movable microphone element 112, for example.

The semiconductor device 100 may comprise at least one opening in order to enable acoustic waves to reach the movable microphone element 112. In other words, the semiconductor device 100 may comprise a first opening for enabling access to a first side of the movable microphone element 112 for acoustic waves. Further, the semiconductor device 100 may comprise a second opening for enabling access also to the second side of the movable microphone element 112 for acoustic waves (e.g. simultaneously or with time delay). Alternatively, a front side of the movable microphone element 112 may be arranged so that acoustic waves can reach the front side of the movable microphone element 112 through an opening of the semiconductor device 100 and an opposite back side of the movable microphone element 112 may be arranged towards an enclosed or encapsulated back side volume. The size of the back side volume may influence the performance (e.g. sensitivity) of the microphone module, for example. For example, a larger back side volume may enable a better performance of the microphone module than a smaller volume.

For example, the movable microphone element 112 may be accessible for acoustic waves from the back side (opposite to the main side) of the first semiconductor die 110 through a hole within the first semiconductor die 110 (e.g. FIG. 1).

Optionally, the second semiconductor die 120 may comprise a hole or opening (e.g. unfilled hole) reaching through the semiconductor die 120. The hole may be arranged opposite to the movable microphone element 112. In other words, the hole or opening may be arranged with a lateral overlap to the movable microphone element 112, for example. By implementing a hole through the second semiconductor die 120, the back volume of the movable microphone element 112 can be increased or an access for acoustic waves may be provided, for example.

The size of the hole and the location of the hole may be selected in a wide range. For example, the hole of the second semiconductor die 120 may be arranged laterally close to the center or at the center of the movable microphone element 112 or close to an edge or at the edge of the movable microphone element (off-center). By arranging the hole of the second semiconductor die 120 away from the center (no lateral overlap of center of movable microphone element and hole), the die may be easier to handle at a die bonding, for example.

The hole may be implemented by etching the second semiconductor die 120. The signal processing module may be implemented on the remaining portion of the second semiconductor die 120 (e.g. before etching the hole).

Optionally, alternatively or additionally to one or more aspects mentioned above, the first semiconductor die 110 and the second semiconductor die 120 may be at least partly enclosed or encapsulated by a molding compound or a cap (e.g. metal cap). For example, the semiconductor device 100 may comprise a molding compound structure partly enclosing the first semiconductor die 110 and the second semiconductor die 120. The molding compound structure may comprise a hole reaching from the hole of the second semiconductor die 120 through the molding compound structure. In this way, the back side volume may be further increased or an access for acoustic waves may be provided, for example.

It may be sufficient to implement a small hole within the second semiconductor die 120 in order to increase the back side volume or enable an access for acoustic waves, for example. In other words, a lateral size or die area of the hole of the second semiconductor die 120 may be smaller than a lateral size or die area of the movable microphone element. For example, the lateral size of the hole of the second semiconductor die 120 may be less than half (or less than one third, less than one fourth, less than 20% or less than 10%) of the lateral size of the movable microphone element 112. By keeping the size of the hole of the second semiconductor die 120 small, the protection of the movable microphone element (e.g. during molding or handling) may be improved, for example.

Alternatively, the second semiconductor die 120 may be significantly smaller (less than 50%, less than 30% or less than 10%) of the die area of the first semiconductor die 110. In this case, the first semiconductor die 110 may provide sufficient space to mount the second semiconductor die 120 at the main side of the first semiconductor die 110 laterally beside the movable microphone element 112. In other words, the second semiconductor die 120 may be mounted to the main side 114 of the first semiconductor die 110 without a lateral overlap with the movable microphone element 112. For example, the first semiconductor die 110 and the second semiconductor die 120 may be at least partly enclosed or encapsulated by a cap. In this way, the movable microphone element 112 may be protected by the cap, for example.

An electrical connection between the first semiconductor die 110 and the second semiconductor die 120 may be implemented in various ways. For example, the first semiconductor die 110 comprises at least one signal output interface (e.g. pad) at the main side 114 electrically connected to at least one signal input interface (e.g. pad) of the second semiconductor die. In this way, the microphone module may be able to provide an output signal (e.g. microphone signal) to the at least one signal output of the first semiconductor die 110, which is electrically connected to the at least one signal input interface of the second semiconductor die 120. The microphone signal may comprise information on a movement of the movable microphone element 112 as mentioned above.

The at least one signal input interface and/or the signal processing module may be implemented at the side of the second semiconductor die 120 facing the first semiconductor die 110 or at a side opposite to the first semiconductor die 110.

For example, the second semiconductor die 120 may be mounted to the first semiconductor die 110 based on a flip-chip assembly. In this way, a signal output interface of the second semiconductor die 120 arranged at a side of the second semiconductor die 120 facing the first semiconductor die 110 can be connected to a signal output interface arranged at the main side 114 of the first semiconductor die 110. Alternatively (or additionally, if interfaces are arranged at both sides), the second semiconductor die 120 may be mounted to the first semiconductor die 110 based on a wire bond assembly (e.g. fixing one die to the other and implementing electrical connections by wire bonding). In this way, a signal input interface of the second semiconductor die 120 arranged at a side of the second semiconductor die 120 opposite to the first semiconductor die 110 can be connected to an output interface of the first semiconductor die 110, for example.

Optionally, additionally or alternatively to one or more aspects mentioned above, the first semiconductor die 110 and the second semiconductor die 120 may comprise the same lateral die size or die area. By using semiconductor dies with equal size, a wafer with first semiconductor dies can be bonded to a wafer with second semiconductor dies.

In this way, a plurality of semiconductor devices may be formed simultaneously so that the costs for manufacturing a proposed semiconductor device can be significantly reduced.

For example, the second semiconductor die 120 may be a flip-chip comprising at least one input interface arranged at the side of the second semiconductor die 120 facing the first semiconductor die 110.

Optionally, alternatively or additionally to one or more aspects, the first semiconductor die 110 and/or the second semiconductor die 120 may comprise at least one through silicon via (TSV) for providing a signal processed by the signal processing module to an output interface of the semiconductor device 100. For example, an output interface of the semiconductor device 100 may be implemented on a back side (opposite to the main side) of the first semiconductor die 110. In order to provide a signal at the output interface at the back side of the first semiconductor device 110, the first semiconductor die 110 may comprise a through silicon via (TSV) providing an electrical connection from the main side 114 to the back side of the first semiconductor die 110.

Further, additionally or alternatively, the second semiconductor die 120 may comprise a through silicon via (TSV) for electrically connecting the signal processing module arranged at a side of the second semiconductor device 120 opposite to the first semiconductor device 110 to the first semiconductor device 110, for example.

A through silicon via (TSV) may be a hole through a semiconductor substrate filled with electrically conductive material electrically insulated from the semiconductor substrate by an insulation layer, for example.

Optionally, additionally or alternatively to one or more aspects mentioned above, the semiconductor device 100 may comprise a lead frame. The lead frame may be mounted to a back side (opposite to the main side) of the first semiconductor die 110. A lead frame may comprise one or more metal leads for providing one or more electrical signals or supply voltages from the semiconductor device to an external device or from an external device to the semiconductor device 100, for example.

The lead frame may comprise at least one pad connected to an output interface of the first semiconductor die 110 arranged at the back side of the first semiconductor die 110. In this way, a processed output signal generated by the signal processing module may be provided to an external device, for example.

The output interface arranged at the back side of the first semiconductor die 110 may be connected through a through silicon via (TSV) to an output interface of the second semiconductor die 120. Alternatively, the at least one pad may be directly connected to the second semiconductor die 120 through a wire bond, for example. Further alternatively or additionally, at least one pad of the lead frame may be connected to an output interface of the first semiconductor die 110 arranged at the main side 114 of the first semiconductor die 110 through a wire bond.

The lead frame may comprise a hole reaching through the lead frame and arranged opposite to the movable microphone element 112, for example. In this way, an access to the movable microphone element 112 for acoustic waves may be provided through the lead frame.

Optionally, additionally or alternatively, to one or more aspects mentioned above, the semiconductor device 100 comprises a circuit board (e.g. printed circuit board, PCB). The lead frame may be mounted to the circuit board. A gap between the lead frame and the circuit board may be completely sealed around the hole providing an enclosed back side volume. An access for acoustic waves to the movable microphone element 112 may be provided through a hole through the second semiconductor device 120, for example. Alternatively, the gap between the lead frame and the circuit board may be sealed around the hole of the lead frame with the exception of a part of the gap causing a directionality of a function of the microphone module (e.g. implementing microphones comprising different sensitivity in different directions). In other words, the sealing around the hole of the lead frame may comprise a slot left open at one side. The remaining sides may be sealed by soldering the lead frame to the circuit board, for example. In other words, a gap between the lead frame and the circuit board may be sealed around the hole of the lead frame with exception of an opening located in a preferred sensitivity direction.

FIG. 2A shows a schematic cross-section and FIG. 2B shows a schematic top view of a semiconductor device 200 according to an embodiment. The implementation of the semiconductor device 200 is similar to the implementation shown in FIG. 1. The semiconductor device 200 comprises a first semiconductor die 110 with a movable microphone element 112 of a microphone module and a second semiconductor die 120 with a signal processing module. Further, the semiconductor device 200 comprises a lead frame 230 mounted to the first semiconductor device 110 and a molding compound structure 240 partly enclosing the first semiconductor die 110, the second semiconductor die 120 and the lead frame 230. The second semiconductor die 120 comprises a hole 222 through the semiconductor die extending also through the molding compound structure 240. The hole 222 through the second semiconductor die 120 and the molding compound structure 240 provides a large or nearly infinite back volume or provides access for acoustic waves to the movable microphone element 112. Further, the second semiconductor die 120 comprises a cavity 226 (e.g. implemented by etching the semiconductor substrate of the second semiconductor die) above or in the region of the movable microphone element 112 in order to enable a sufficient movement of the movable microphone element 112 (e.g. MEMS membrane). The second semiconductor die 120 comprises a signal processing module representing an ASIC (application-specific integrated circuit) and the first semiconductor die 110 comprises a microphone module with an MEMS membrane implementing an MEMS microphone, for example. Connection interfaces of the first semiconductor die 110 may be connected to connection interfaces 224 (e.g. input and/or output pad) of the second semiconductor die 120 based on a flip-chip assembly. Further, connection interfaces of the first semiconductor die 110 may be connected to pads of the lead frame 230 by wires 232 implemented by wire bonding, for example. The lead frame 230 may comprise a hole 231 through the lead frame 230 arranged opposite to the movable microphone element 112. By implementing the hole 231 through the lead frame 230, a large or nearly infinite back volume or access for acoustic waves to the movable microphone element 112 may be provided, for example.

In other words, FIGS. 2A and 2B show an example of a stack configuration with one flip-chip and one wire bond in a cross-section and in a top view. The ASIC of the second semiconductor die is implemented with an opening to open up an (nearly) infinite back volume, an off-center opening for easy handling at die bonding DB and/or package pick-and-place at a surface mount technology SMT and a pad-to-pad interconnection to enable a small gap to limit an epoxy molding compound EMC sip in, for example. The molding may be done with slow and low compact pressure and/or bigger filler size to prevent EMC sip in MEMS (micro-electro-mechanical system represented by the movable microphone element), for example. The lead frame comprises a center opening to open up (nearly) infinite back volume, for example. The connection between the first semiconductor die (MEMS) to the lead (lead frame) is implemented by a wire bond WB. The signal processing may be performed at the ASIC and may be sent back to the MEMS die. The ground pad (e.g. corner pad) may be implemented so that the pad surface is only exposed at one side (e.g. for shielding grounding purpose).

FIG. 3A shows a schematic cross section and FIG. 3B a schematic top view of a semiconductor device 300 according to an embodiment. The implementation of the semiconductor device 300 is similar to the implementation shown in FIGS. 2A and 2B. However, the first semiconductor die 110 is mounted to the lead frame 230 based on a flip-chip assembly instead of the wire bonding shown in FIGS. 2A and 2B. Further, the first semiconductor die 110 and the second semiconductor die 120 comprise the same die size. The first semiconductor die 110 comprises through silicon vias (TSVs) 312 in order to provide signals from the first semiconductor die 110 and/or the second semiconductor die 120 to the lead frame 230. Additionally, the first semiconductor die 110 comprises a cavity beneath the movable microphone element 112 with a hole 314 to the back side of the first semiconductor die 110 in order to increase the back volume or enable an access for acoustic waves to the movable microphone element 112 (e.g. MEMS membrane). The hole 314 between the cavity and the back side of the first semiconductor die 110 comprises a significantly smaller size than the movable microphone element 112. A fast curing glue 350 (e.g. snap cure glue) is used to seal the gap between the first semiconductor die 110 and the lead frame 230 around the hole 314 at the back side of the first semiconductor die 110.

For example, FIGS. 3A and 3B show a stack with through silicon vias (TSVs) and a two flip-chip FC concept, in a cross-sectional view and a top view (package). Similar to the semiconductor device shown in FIGS. 2A and 2B, the lead frame comprises an opening 231 on a pad and the ASIC comprises an opening 222 as well (e.g. to open up back volume). Further, the molding may be done by a film-assisted molding to ensure the opening (of the second semiconductor die) is not blocked, for example. In this way, the semiconductor material (e.g. silicon, Si) is not directly exposed on top to enable a robust handling, for example. The connection between the first semiconductor die 110 and the second semiconductor die 120 is implemented by a pad (ASIC) to pad (MEMS) interconnection. Further, through silicon via (TSV) connections 312 and flip-chip interconnects 324 (e.g. short copper Cu pillar) implement an electric connection to the lead frame 240. The dies comprise the same die size. In this way, a wafer-to-wafer bonding may be enabled, which may ensure a high accuracy and may save one time die bonding, for example. Further, during die bonding, the ASIC wafer back may be handled and the MEMS may be protected. Therefore, a normal die bonding process may be used, for example. The first semiconductor die 110 comprises in one embodiment a T-shaped (cavity beneath movable microphone element and hole to the back side) opening. In this way, a robust die place process may be enabled (e.g. frame pad not hitting MEMS opening side walls), an increased die strength may be provided, the die may be thinner than 400 μm (e.g. nevertheless providing sufficient back volume), where both front and back comprise openings and/or a thinner die may have shorter through silicon vias (TSVs) to etch, for example.

FIG. 4 shows a schematic cross-section of a semiconductor device 400 according to an embodiment. The implementation of the semiconductor device 400 is similar to the implementation shown in FIGS. 2A and 2B. However, the second semiconductor die 120 is electrically connected to the first semiconductor die 110 by wire bonding instead of a flip-chip assembly. In this way, through silicon vias (TSVs) may be avoided since the pads of the second semiconductor die 120 are connected through wires 432 to pads of the first semiconductor die 110 and pads of the first semiconductor die 110 are connected to the lead from 230 through wires 232. Further, a fast-curing glue 450 may be used to mount the second semiconductor die 120 to the first semiconductor die 110. The fast-curing glue 450 may seal the gap between the first semiconductor die 110 and the second semiconductor die 120 in order to protect the MEMS membrane (movable microphone element). Further, the lead frame 230 is mounted to a circuit board 430 (e.g. consumer PCB) through solder connections 434, for example. The circuit board 430 may be part of the semiconductor device 400 or may be provided by an external device or application using the semiconductor device 400.

For example, FIG. 4 shows a concept for a stack with wire bonding WB and molding by a cross-sectional view. The second semiconductor die 120 comprises a circuitry on top and the sound port opening 222 may become small in order to minimize the area wastage, for example. A spacer glue 450 between the first semiconductor die 110 and the second semiconductor die 120 may be used to maintain a gap. If the spacer glue can ensure a sufficient gap, a back etch of the ASIC (cavity at the back side of the ASIC above the movable microphone element) may be avoided or is not necessary, for example. Further, a spacer glue 350 between the first semiconductor die 110 and the lead frame 230 may be used to maintain a gap. Additionally, a space between the package (lead frame) and the printed circuit board 430 may be used as back volume as well (e.g. omnidirectional case). The first semiconductor die 110 may comprise a larger lateral size than a center pad with the opening 231 of the lead frame 230, so that the size of the package may be kept low. In other words, the die may overhang the central pad of the lead frame for a small footprint, for example.

FIG. 5 shows a schematic cross-section of a semiconductor device 500 according to an embodiment. The implementation of the semiconductor device 500 is similar to the implementation shown in FIG. 4. However, the second semiconductor die 120 is implemented without a cavity or back etch at the side facing the movable microphone element 112, since the gap between the first semiconductor die 110 and the second semiconductor die 120 is sufficiently large due to the spacer glue 450 between the dies.

FIG. 6A shows a schematic top view of a possible lead frame 230 for the semiconductor device shown in FIG. 5. The lead frame 230 comprises one central pad 610 (Package center pad) with a hole 231 and four corner pads 620.

Further, FIGS. 6B and 6C show schematic illustrations of soldering patterns on the sound port (PCB pad implementation) with a directional and an omnidirectional possibility, for example. FIG. 6B shows a directional implementation with a partially sealed port pad 610. Only three edges are soldered. Sound waves can enter from the fourth side (open side). The sound waves may have good delay between the top and bottom sound board as the top port implementation (hole through second semiconductor die) may be like a channel directing sound to the MEMS membrane (faster and direct). Further, more impedance may be made to the bottom port by introducing more solder pad and restrictions for sound travel in making the microphone direction, for example. For the omnidirectional implementation, the port pad may be fully sealed as shown in FIG. 6C. The pads on the circuit board 630 (e.g. customer PCB) of the omnidirectional implementation surround the hole 231 of the center pad 610 of the lead frame, completely, while one side (or a part of one side) is left open by the pads on the circuit board 630 in the directional implementation shown in FIG. 6B, for example.

FIG. 7 shows a schematic cross-section of a semiconductor device 700 according to an embodiment. The implementation of the semiconductor device 700 is similar to the implementation shown in FIG. 5. However, the first semiconductor die 110 and the second semiconductor die 120 are enclosed by a cap 710 (e.g. metal cap) instead of a molding compound. The lead frame 230 comprises additional pads or a ring (grounding ring) for electrically connecting the cap 710 to a reference potential (e.g. ground). The lead frame 230 is implemented as a pre-mold frame with mold compound 720 between the pads, for example. For example, FIG. 7 shows a concept for a stack with wire bonding WB and metal cover in a cross-sectional view.

The opening through the second semiconductor die 120 enables an increase of the back side volume of the movable microphone element 112 to the volume enclosed by the cap 710. Acoustic waves may reach the movable microphone element 112 through the opening or hole 231 within the center pad of the lead frame 230.

Figure 8:
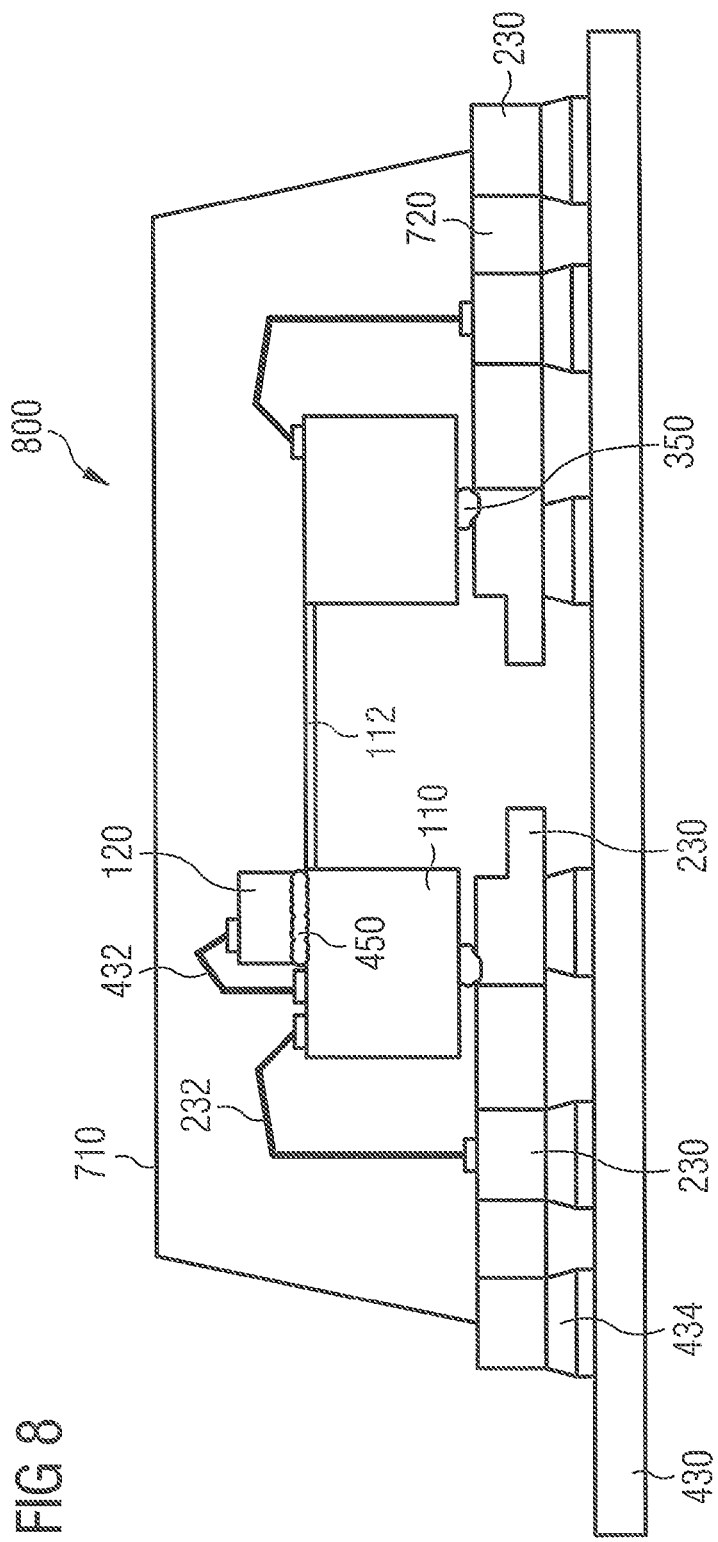
FIG. 8 shows a schematic cross-section of a further semiconductor device.

FIG. 8 shows a schematic cross-section of a semiconductor device 800 according to an embodiment. The implementation of the semiconductor device 800 is similar to the semiconductor device shown in FIG. 7. However, the second semiconductor die 120 in this embodiment is significantly smaller than the first semiconductor die 110. In this case, the first semiconductor die 110 provides sufficient space to arrange the second semiconductor die 120 beside the movable microphone element 112. Therefore, the second semiconductor die 120 can be implemented without the hole through the second semiconductor die 120. The movable microphone element 112 may be protected by the cap 710 and a large back side volume can be provided by the volume enclosed by the cap 710, for example. For example, FIG. 8 shows a concept for a stack (e.g. shrink ASIC) with wire bonding WB 432, 232 and metal cover in a cross-sectional view.

Figure 9:
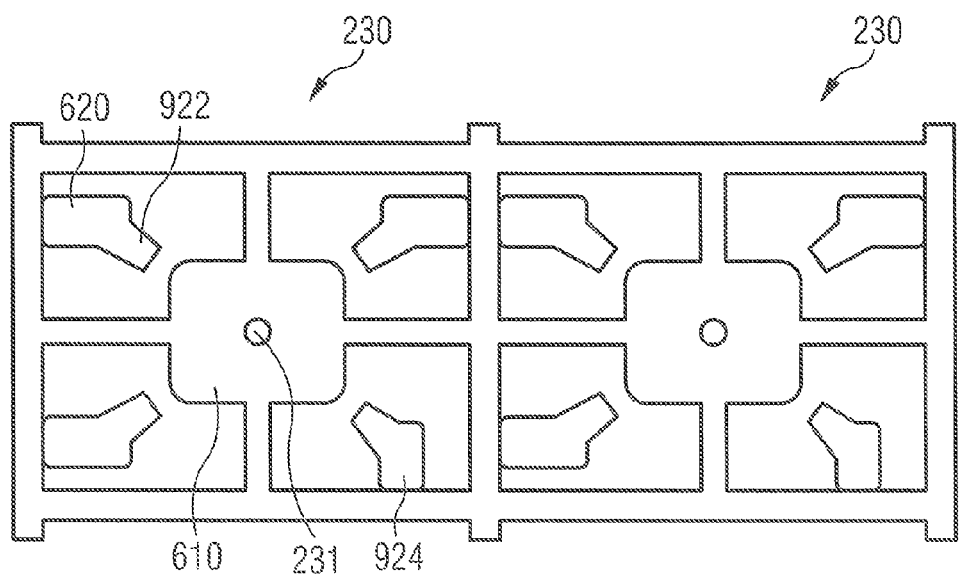
FIG. 9 shows a schematic top view of lead frames.
Figure 10:
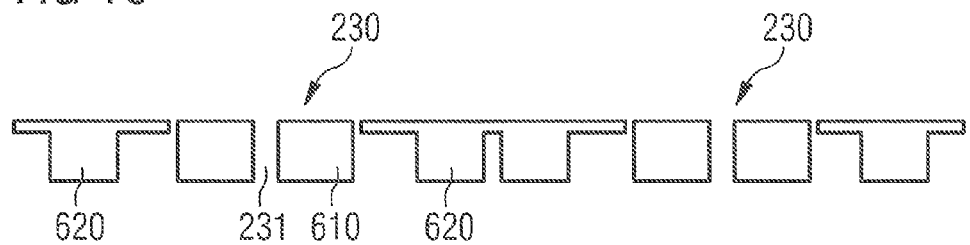
FIG. 10 shows a schematic cross-section of the lead frames shown in FIG. 9.

FIG. 9 shows a schematic top view and FIG. 10 shows a schematic cross-section of lead frames 230 usable for the semiconductor devices shown in FIGS. 3A, 3B, 4 and 5. Two lead frames 230 still connected to each other are shown. Each lead frame 230 comprises a center pad 610 with an opening 231. Further, each lead frame 230 comprises pads 620 (four corner pads) for flip-chip FC bonding. The pads may comprise a half etch 922 for extending lead if necessary (e.g. small die size, bigger package pad pitch) and/or a non-half etch lead 924, which can be used for grounding if shielding may be necessary or may be exposed after package sawing at one side (e.g. X or Y direction) only, for example. FIGS. 9 and 10 show a concept or design of a possible lead frame (TSNP, Thin Small Non-leaded Package).

FIG. 11 shows a schematic top view of a possible lead frame 230 for a semiconductor device shown in FIGS. 7 and 8. The lead frame 230 is similar to the lead frame shown in FIGS. 9 and 10 but comprises an additional grounding ring 1030. Further, a side view 1040 of the half-etch from top exposed from the bottom is illustrated. In this example, a precut may be done to isolate from ground rings, for example. Further, side views 1050 of the half-etch from bottom to have the full ground ring complete from the top to fully seal with the metal cap after reflow is illustrated, for example.

Some embodiments relate to a lead frame stack silicon Si microphone package with ASIC opening and flexibility on acoustic ports and back volume on PCB or a lead frame stack silicon Si microphone package with (nearly) infinite back volume. A proposed device may replace an expensive laminate-based silicon microphone package, a big footprint with side-by-side configuration, a relatively long process time with wire bonding, a multiple die bond and/or globe top molding and/or a relatively limited back volume, for example. A proposed silicon microphone may be lead frame based and stack MEMS and ASIC. The lead frame based concept (e.g. TSNP PPF, Thin Small Non-leaded Package Pre-plated Frame) may be very cost-effective. The stack configuration may provide a smaller footprint and the ASIC itself may be used to seal the MEMS from the molding compound, for example. Further, the possibility to enable a wafer-to-wafer bonding may be provided by designing the same die size for MEMS (first semiconductor die) and ASIC (second semiconductor die) to have only one-time die bonding DB at the back end BE, for example. The ASIC with an opening may enable the possibility to have both top and bottom acoustic ports and/or a selectively for sealing the bottom pad, for example. In this way, more back volume may be provided due to utilizing the volume between package and PCB. Further, with selectivity, the same silicon microphone (Si mic) package may be used as directional or omnidirectional silicon microphone with different (customer) PCB pad layout design or recommendation. In this way, the package variants may be cut down and a better economy of scale may be provided, for example.

A proposed module with integrated passive package may be more cost-effective (e.g. direct material and assembly) and may provide a better performance, for example. A lead frame based silicon microphone with stacked MEMS and ASIC with flip-chip interconnection may be provided. The ASIC may be implemented with an opening to open up a back space volume, for example. With an ASIC opening at the die center, the back volume may be opened up to nearly infinity, which may improve the performance. Further, less packaging process steps may be necessary resulting in lower operation costs and better yield, for example.

FIG. 12 shows a schematic cross-section of a semiconductor device 1200 according to an embodiment. The semiconductor device 1200 comprises a microphone module implemented on a first semiconductor die 1210 and a signal processing module implemented on a second semiconductor 1220. The second semiconductor die 1220 is mounted to a first side of the first semiconductor die 1210. Further, a lead frame 1230 is mounted to a second side of the first semiconductor die 1210.

By mounting the signal processing die on the microphone die and using a lead frame, the semiconductor device 1200 may be implemented with low space consumption and low costs, for example.

The microphone module may comprise at least a movable microphone element and may be arranged at the first side (as shown in FIG. 1) or the second side. In comparison to the example shown in FIG. 1, the movable microphone element may be arranged at the second side of the first semiconductor die 1210 alternatively. More details or aspects (e.g. regarding the microphone module, the first semiconductor die, the second semiconductor die, the signal processing module or the lead frame) are mentioned in connection with the proposed concept or the embodiments described above (e.g. FIG. 1).

The semiconductor device 1200 may comprise one or more additional optional features corresponding to one or more aspects described in connection with the proposed concept or one or more embodiments described above.

Some embodiments relate to a microphone device comprising a semiconductor device according to the described concept or one or more embodiments described above. In other words, a semiconductor device according to the described concept or one or more embodiments described above may represent or implement a microphone. For example, the microphone may be a silicon microphone indicating that at least the first semiconductor die is a silicon die, for example. Some embodiments relate to a cell phone, a laptop, a headset or a tablet comprising a semiconductor device according to the described concept or one or more embodiments described above.

FIG. 13 shows a flowchart of a method 1300 for forming a semiconductor device according to an embodiment. The semiconductor device comprises a microphone module implemented on a first semiconductor die and a signal processing module implemented on a second, different semiconductor die. Further, the microphone module comprises a movable microphone element arranged a main side of the first semiconductor die. The method 1300 comprises mounting 1330 the second semiconductor die on the main side of the first semiconductor die.

By mounting the second semiconductor die on the first semiconductor die, a semiconductor device with low space consumption may be provided.

The first semiconductor die and/or the second semiconductor die may be formed externally and provided for the mounting at 1330 or the first semiconductor die and/or the second semiconductor die may be formed before the mounting at 1330. In other words, the method 1300 may optionally comprise forming at 1310 a microphone module on a first semiconductor die and optionally forming at 1320 a processing module on a second semiconductor die.

The method 1300 may comprise one or more additional optional acts corresponding to one or more aspects described in connection with the proposed concept or one or more embodiments described above.

FIG. 14 shows a flowchart of a method 1400 for forming a semiconductor device according to an embodiment. The method 1400 comprises a pre-assembling at 1410 of the first semiconductor die and/or the second semiconductor die and a first die bonding DB1 at 1420 of the second semiconductor die to the first semiconductor die. Further, the method 1400 comprises a glue curing at 1430 and a second die bonding DB2 at 1440 of the first semiconductor die to a lead frame. Additionally, the method 1400 comprises a wire bonding at 1450 and a molding and laser marking at 1460. Afterwards, the package may be sawed at 1470 and a conductive ink spray (shielding) may be implemented and cured at 1480. Further, vision, test and/or tapping may be performed at 1490.

In this way, a process flow for a stack with wire bonding may be implemented.

FIG. 15 shows a flowchart of a method 1500 for forming a semiconductor device according to an embodiment. The method 1500 comprises a pre-assembly at 1510 of first semiconductor dies and second semiconductor dies and a wafer-to-wafer bonding at 1520 of the wafer with first semiconductor dies and the wafer with the second semiconductor dies. Further, the method 1500 comprise a die bonding DB at 1530 of the first semiconductor die to the lead frame and a molding and laser marking at 1540. Further, the method 1500 comprises a package sawing at 1550 and implementing a conductive ink spray (shielding) and curing at 1560. Further, the method 1500 may comprise vision, test and tapping at 1570.

In this way, a process flow for a stack with through silicon vias (TSVs) and flip-chip FC may be provided, for example.

The method shown in FIGS. 14 and 15 may require a low number of process steps resulting in lower operation costs and less yield loss, for example.

Embodiments may further provide a computer program having a program code for performing one of the above methods, when the computer program resides on a non-transitory medium and is executed on a computer or processor. A person of skill in the art would readily recognize that steps of various above-described methods may be performed by programmed computers. Herein, some embodiments are also intended to cover program storage devices, e.g., digital data storage media, which are machine or computer readable and encode machine-executable or computer-executable programs of instructions, wherein the instructions perform some or all of the acts of the above-described methods. The program storage devices may be, e.g., digital memories, magnetic storage media such as magnetic disks and magnetic tapes, hard drives, or optically readable digital data storage media. The embodiments are also intended to cover computers programmed to perform the acts of the above-described methods or (field) programmable logic arrays ((F)PLAs) or (field) programmable gate arrays ((F)PGAs), programmed to perform the acts of the above-described methods.

The description and drawings merely illustrate the principles of the disclosure. It will thus be appreciated that those skilled in the art will be able to devise various arrangements that, although not explicitly described or shown herein, embody the principles of the disclosure and are included within its spirit and scope. Furthermore, all examples recited herein are principally intended expressly to be only for pedagogical purposes to aid the reader in understanding the principles of the disclosure and the concepts contributed by the inventor(s) to furthering the art, and are to be construed as being without limitation to such specifically recited examples and conditions. Moreover, all statements herein reciting principles, aspects, and embodiments of the disclosure, as well as specific examples thereof, are intended to encompass equivalents thereof.

Functional blocks denoted as "means for . . . " (performing a certain function) shall be understood as functional blocks comprising circuitry that is configured to perform a certain function, respectively. Hence, a "means for s.th." may as well be understood as a "means configured to or suited for s.th.". A means configured to perform a certain function does, hence, not imply that such means necessarily is performing the function (at a given time instant).

Functions of various elements shown in the figures, including any functional blocks labeled as "means", "means for providing a sensor signal", "means for generating a transmit signal.", etc., may be provided through the use of dedicated hardware, such as "a signal provider", "a signal processing unit", "a processor", "a controller", etc. as well as hardware capable of executing software in association with appropriate software. Moreover, any entity described herein as "means", may correspond to or be implemented as "one or more modules", "one or more devices", "one or more units", etc. When provided by a processor, the functions may be provided by a single dedicated processor, by a single shared processor, or by a plurality of individual processors, some of which may be shared. Moreover, explicit use of the term "processor" or "controller" should not be construed to refer exclusively to hardware capable of executing software, and may implicitly include, without limitation, digital signal processor (DSP) hardware, network processor, application specific integrated circuit (ASIC), field programmable gate array (FPGA), read only memory (ROM) for storing software, random access memory (RAM), and non-volatile storage. Other hardware, conventional and/or custom, may also be included.

It should be appreciated by those skilled in the art that any block diagrams herein represent conceptual views of illustrative circuitry embodying the principles of the disclosure. Similarly, it will be appreciated that any flow charts, flow diagrams, state transition diagrams, pseudo code, and the like represent various processes which may be substantially represented in computer readable medium and so executed by a computer or processor, whether or not such computer or processor is explicitly shown.

Furthermore, the following claims are hereby incorporated into the Detailed Description, where each claim may stand on its own as a separate embodiment. While each claim may stand on its own as a separate embodiment, it is to be noted that—although a dependent claim may refer in the claims to a specific combination with one or more other claims—other embodiments may also include a combination of the dependent claim with the subject matter of each other dependent or independent claim. Such combinations are proposed herein unless it is stated that a specific combination is not intended. Furthermore, it is intended to include also features of a claim to any other independent claim even if this claim is not directly made dependent to the independent claim.

It is further to be noted that methods disclosed in the specification or in the claims may be implemented by a device having means for performing each of the respective acts of these methods.

Further, it is to be understood that the disclosure of multiple acts or functions disclosed in the specification or claims may not be construed as to be within the specific order. Therefore, the disclosure of multiple acts or functions will not limit these to a particular order unless such acts or functions are not interchangeable for technical reasons. Furthermore, in some embodiments a single act may include or may be broken into multiple sub acts. Such sub acts may be included and part of the disclosure of this single act unless explicitly excluded.

What is claimed is:

1. A semiconductor device comprising:
    a microphone module implemented on a first semiconductor die, wherein the microphone module comprises a moveable microphone element arranged at a main side of the first semiconductor die;
    a signal processing module implemented on a second, different semiconductor die, wherein the second semiconductor die is mounted to the main side of the first semiconductor die;
    a lead frame mounted to a back side of the first semiconductor die, the lead frame comprising a hole to access the microphone module, wherein the hole extends through the lead frame and is arranged opposite to the moveable microphone element; and
    a circuit board mounted to the lead frame, wherein a gap between the lead frame and the circuit board is sealed around the hole of the lead frame with exception of an opening located in a preferred sensitivity direction in the gap between the lead frame and the circuit board.

2. The semiconductor device according to claim 1, wherein the second semiconductor die comprises a hole extending through the second semiconductor die.

3. The semiconductor device according to claim 2, further comprising a moulding compound structure partly enclosing the first semiconductor die and the second semiconductor die, wherein the moulding compound structure comprises a hole extending from the hole of the second semiconductor die through the moulding compound structure.

4. The semiconductor device according to claim 2, wherein a lateral size of the hole of the second semiconductor die is smaller than a lateral size of the moveable microphone element.

5. The semiconductor device according to claim 1, wherein the first semiconductor die comprises at least one signal output interface at the main side electrically connected to at least one signal input interface of the second semiconductor die, wherein the microphone module is configured to provide a microphone signal to the at least one signal output, wherein the microphone signal comprises information on a movement of the moveable microphone element.

6. The semiconductor device according to claim 5, wherein the at least one signal input interface of the second semiconductor die is arranged at a side of the second semiconductor die facing the first semiconductor die.

7. The semiconductor device according to claim 1, wherein the second semiconductor die is mounted to the first semiconductor die based on a flip chip assembly.

8. The semiconductor device according to claim 5, wherein the at least one signal input interface of the second semiconductor die is arranged at a side of the second semiconductor die opposite to the first semiconductor die.

9. The semiconductor device according to claim 1, wherein the second semiconductor die is mounted to the first semiconductor die based on a wire bond assembly.

10. The semiconductor device according to claim 1, wherein the first semiconductor die and the second semiconductor die comprise the same lateral die size.

11. The semiconductor device according to claim 1, wherein the first semiconductor die or the second semiconductor die comprises at least one through silicon via for providing a signal processed by the signal processing module to an output interface of the semiconductor device.

12. The semiconductor device according to claim 1, wherein the lead frame comprises at least one pad connected to an output interface of the first semiconductor die arranged at the backside of the first semiconductor die.

13. The semiconductor device according to claim 12, wherein the output interface arranged at the backside of the first semiconductor die is connected through a through silicon via to an output interface of the second semiconductor die.

14. The semiconductor device according to claim 1, wherein the lead frame comprises at least one pad connected to an output interface of the first semiconductor die arranged at the main side of the first semiconductor die through a wire bond.

15. A method for forming a semiconductor device comprising a microphone module implemented on a first semiconductor die and a signal processing module implemented on a second semiconductor die, wherein the microphone module comprises a moveable microphone element arranged at a main side of the first semiconductor die, wherein the method comprises:

mounting the second semiconductor die to the main side of the first semiconductor die;

mounting a lead frame to a back side of the first semiconductor die, the lead frame comprising a hole to access the microphone module, wherein the hole extends through the lead frame and is arranged opposite to the moveable microphone element; and mounting a circuit board to the lead frame, wherein a gap between the lead frame and the circuit board is sealed around the hole of the lead frame with exception of an opening located in a preferred sensitivity direction in the gap between the lead frame and the circuit board.

16. The semiconductor device according to claim 1, wherein the second semiconductor die has no lateral overlap with the moveable microphone element.

* * * * *